(12) United States Patent
Jin et al.

(10) Patent No.: US 12,116,267 B2
(45) Date of Patent: Oct. 15, 2024

(54) CONTROLLING ONE OR MORE ELECTROSTATIC COMB STRUCTURES OF A MICRO-ELECTRO-MECHANICAL SYSTEM DEVICE

(71) Applicant: Lumentum Operations LLC, San Jose, CA (US)

(72) Inventors: Wenlin Jin, Ottawa (CA); Edward Wang, Ottawa (CA)

(73) Assignee: Lumentum Operations LLC, San Jose, CA (US)

( * ) Notice: Subject to any disclaimer, the term of this patent is extended or adjusted under 35 U.S.C. 154(b) by 500 days.

(21) Appl. No.: 17/538,784

(22) Filed: Nov. 30, 2021

(65) Prior Publication Data

US 2023/0113224 A1 Apr. 13, 2023

Related U.S. Application Data

(60) Provisional application No. 63/261,897, filed on Sep. 30, 2021.

(51) Int. Cl.
*B81B 3/00* (2006.01)
*G02B 26/08* (2006.01)

(52) U.S. Cl.
CPC ........ *B81B 3/0059* (2013.01); *G02B 26/0841* (2013.01); *B81B 2203/0136* (2013.01)

(58) Field of Classification Search
CPC ............ G02B 26/0816; G02B 26/0825; G02B 26/0833; G02B 26/0841; G02B 26/10; G02B 26/12; G02B 26/101; B81B 3/00; B81B 3/0008; B81B 3/0059; B81B 3/0097; B81B 2203/00; B81B 2203/01; B81B 2203/0136; B81B 2203/04
See application file for complete search history.

(56) References Cited

U.S. PATENT DOCUMENTS

| | | | |
|---|---|---|---|
| 2009/0268270 A1* | 10/2009 | Keyworth | B81B 3/0062 359/226.1 |
| 2014/0132917 A1* | 5/2014 | Tamamori | A61B 3/1225 359/849 |
| 2021/0271072 A1* | 9/2021 | Schroedter | G02B 7/185 |

* cited by examiner

*Primary Examiner* — Sultan Chowdhury
(74) *Attorney, Agent, or Firm* — Harrity & Harrity, LLP

(57) ABSTRACT

A micro-electro-mechanical system (MEMS) device includes a mirror; at least one hinge; an electrostatic comb structure; and a control device. The control device causes, for a period of time, a voltage to be supplied to the electrostatic comb structure to cause the electrostatic comb structure to tilt the mirror about the at least one hinge in a particular direction. The control device causes, after the period of time and at an instant of time, the voltage to cease being supplied to the electrostatic comb structure. A tilt angle of the mirror, at the first instant of time, is less than a maximum tilt angle of the mirror in the particular direction. An angular momentum of the mirror, at the instant of time, is greater than zero kilogram meters squared per second in the particular direction.

20 Claims, 7 Drawing Sheets

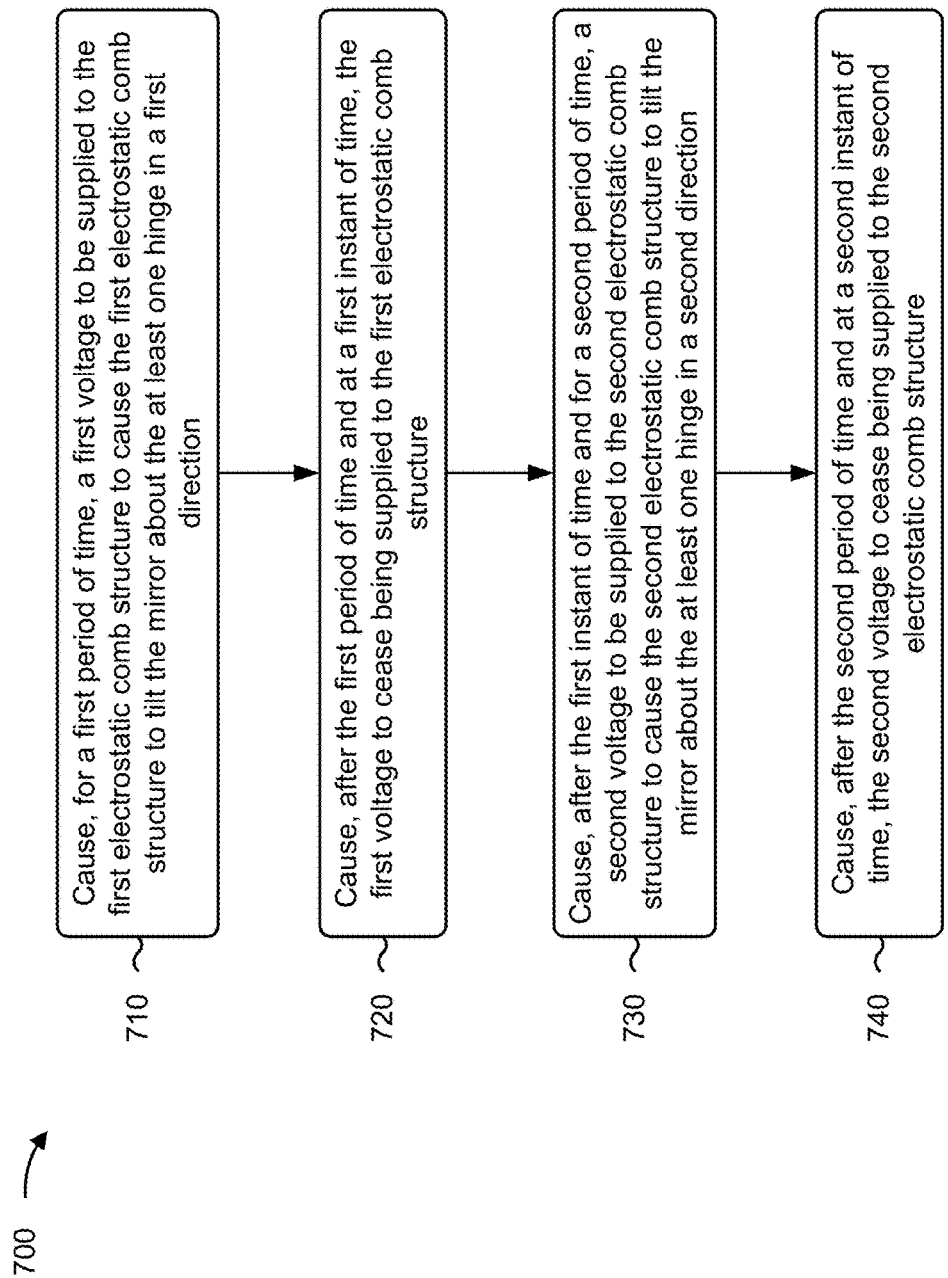

CONTROLLING ONE OR MORE ELECTROSTATIC COMB STRUCTURES OF A MICRO-ELECTRO-MECHANICAL SYSTEM DEVICE

CROSS-REFERENCE TO RELATED APPLICATION

This Patent application claims priority to U.S. Provisional Patent Application No. 63/261,897 filed on Sep. 30, 2021, and entitled "PARTIAL DRIVING COMBS FOR LARGE TILTING MIRRORS." The disclosure of the prior Application is considered part of and is incorporated by reference into this Patent Application.

TECHNICAL FIELD

The present disclosure relates to a micro-electro-mechanical system (MEMS) device and to electrostatic comb structures.

BACKGROUND

A micro-electro-mechanical system (MEMS) device is a micro-sized structure that has electronic and mechanical components and may include a mirror for reflecting light. For example, a MEMS device may include a mirror that can be used to reflect or otherwise direct light (e.g., a laser beam) in various applications, such as a light detection and ranging (LIDAR) application, a sensing application, and/or an optical communications application, among other examples. When the MEMS device is actuated, the mirror may be tilted about an axis, which may cause an optical beam that was falling upon the mirror and reflecting in one direction to fall upon the mirror and reflect in a different direction.

SUMMARY

In some implementations, a micro-electro-mechanical system (MEMS) device includes a mirror; at least one hinge; a first electrostatic comb structure; a second electrostatic comb structure; and a control device, configured to: cause, for a first period of time, a first voltage to be supplied to the first electrostatic comb structure to cause the first electrostatic comb structure to tilt the mirror about the at least one hinge in a first direction; cause, after the first period of time and at a first instant of time, the first voltage to cease being supplied to the first electrostatic comb structure, wherein a tilt angle of the mirror, at the first instant of time, is less than a maximum tilt angle of the mirror in the first direction; cause, after the first instant of time and for a second period of time, a second voltage to be supplied to the second electrostatic comb structure to cause the second electrostatic comb structure to tilt the mirror about the at least one hinge in a second direction; and cause, after the second period of time and at a second instant of time, the second voltage to cease being supplied to the second electrostatic comb structure, wherein the tilt angle of the mirror, at the second instant of time, is less than a maximum tilt angle of the mirror in the second direction.

In some implementations, a control device includes one or more processors to: cause, for a first period of time, a first voltage to be supplied to a first electrostatic comb structure of a MEMS device to cause the first electrostatic comb structure to tilt a mirror of the MEMS device about at least one hinge of the MEMS device in a first direction; and cause, after the first period of time and at a first instant of time, the first voltage to cease being supplied to the first electrostatic comb structure, wherein a tilt angle of the mirror, at the first instant of time, is less than a maximum tilt angle of the mirror in the first direction.

In some implementations, a method includes causing, by a control device and for a period of time, a voltage to be supplied to an electrostatic comb structure of a MEMS device to cause the electrostatic comb structure to tilt a mirror of the MEMS device about at least one hinge of the MEMS device in a particular direction; and cause, by the control device, after the period of time and at an instant of time, the voltage to cease being supplied to the electrostatic comb structure, wherein an angular momentum of the mirror, at the instant of time, is greater than zero kilogram meters squared per second in the particular direction.

BRIEF DESCRIPTION OF THE DRAWINGS

FIG. 7 is a flowchart of an example process relating to controlling one or more electrostatic comb structures of a MEMS device.

DETAILED DESCRIPTION

Figure 1:
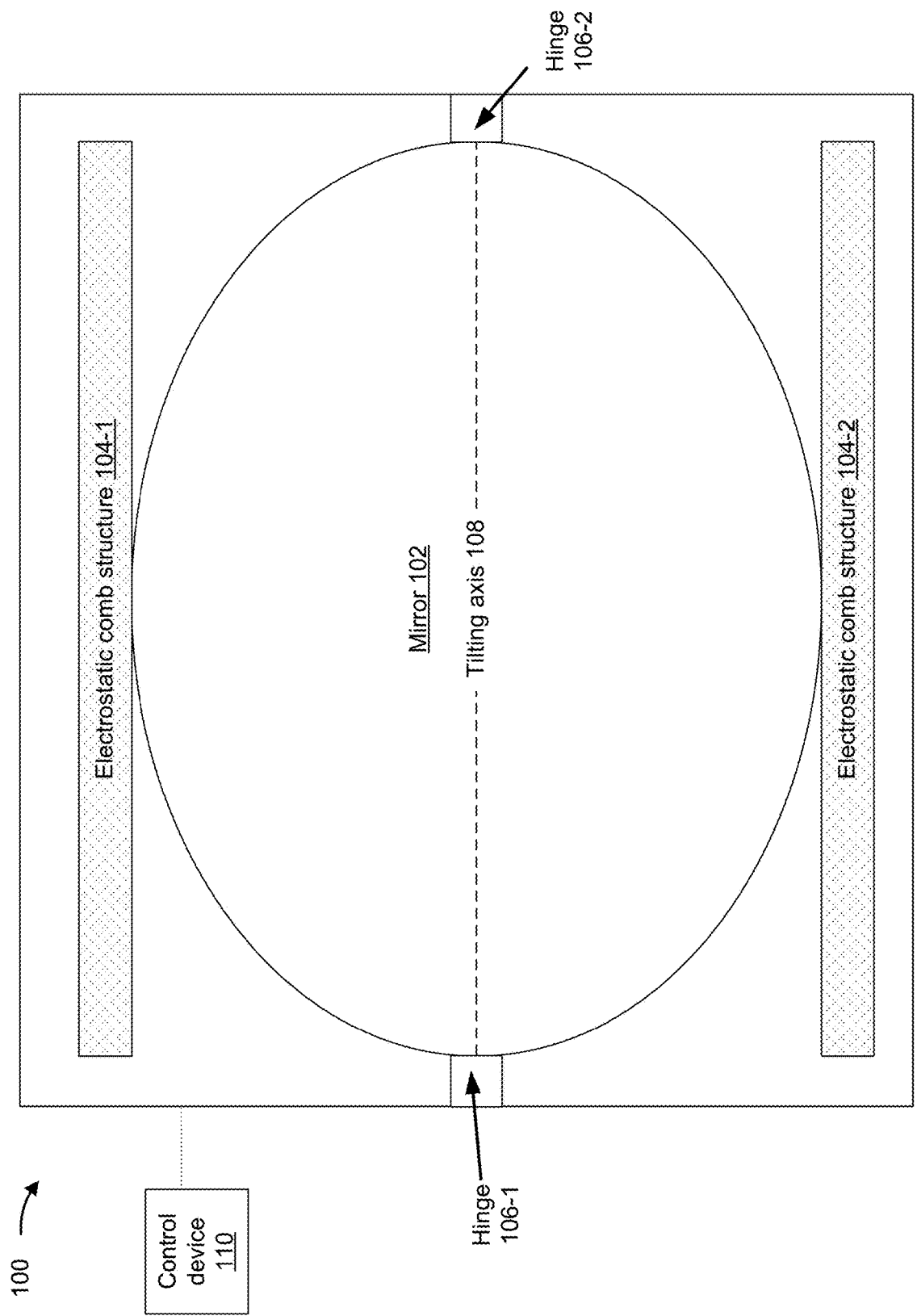
FIG. 1 is a diagram of an example micro-electro-mechanical system (MEMS) device described herein.

The following detailed description of example implementations refers to the accompanying drawings. The same reference numbers in different drawings may identify the same or similar elements.

A light detection and ranging (LIDAR) system detects an object by illuminating the object with an optical beam (e.g., a laser beam) and measuring characteristics of a reflected optical beam. A vehicle, such as a semiautonomous or fully autonomous vehicle, may use a LIDAR system to detect objects (e.g., other vehicles, pedestrians, road debris, and/or other objects) in a path of the vehicle. A typical LIDAR system includes a beam deflection unit that deflects both projected optical beams and reflected optical beams. However, the beam deflection unit spins in place and is therefore subject to mechanical wear and tear (e.g., from friction, abrasion, and/or other factors). Accordingly, for many applications, such as autonomous vehicle applications, a more robust solid-state LIDAR system is desired.

In some cases, a solid-state LIDAR system may use one or more MEMS devices to deflect projected optical beams and reflected optical beams. For such a LIDAR system to provide a long range and wide field-of-view, a MEMS device of the LIDAR system should include a large mirror that can provide wide deflection angles.

In many cases, the MEMS device uses an electrostatic comb structure (e.g., comprising a stator comb actuator and a rotor comb actuator) to provide a driving torque to tilt the mirror on a hinge of the MEMS device. An effective driving range of the electrostatic comb actuator structure is defined by full engagement of teeth of the rotor comb actuator and teeth of the stator comb actuator. Beyond the effective driving range, a driving efficiency of the electrostatic comb actuator structure becomes negative. Accordingly, an electrostatic comb actuator structure is configured to work within its effective driving range in a typical MEMS device design, which limits a range of tilt angles to which the mirror can be driven by the electrostatic comb structure.

In a conventional MEMS device, a pair of electrostatic comb actuator structures are positioned at opposite (horizontal) sides of the mirror of the MEMS device (e.g., in line with the tilting axis of the mirror). This configuration enables the electrostatic comb structures to provide enough driving torque to provide wide deflection angles, but creates, because the electrostatic comb structures extend away from the sides of the mirror (e.g., in a horizontal direction), substantial unused regions of a chip of the conventional MEMS device. This often accounts for a significant portion of a total size (e.g., an XY footprint) of the chip. This can lead to a large chip size, which is costly to produce, and, in some cases, the chip size prevents the conventional MEMS device from being included in some LIDAR systems.

Some implementations described herein provide a MEMS device that includes a mirror and one or more electrostatic comb actuator structures. The one or more electrostatic comb structures may be configured to enable tilting of the mirror beyond an effective driving range of the one or more electrostatic comb structures. For example, a control device may cause a first voltage to be supplied to a first electrostatic comb structure to cause the first electrostatic comb structure to tilt the mirror about at least one hinge of the MEMS device in a first direction. Then, the control device may cause the first voltage to cease being supplied to the first electrostatic comb structure. This may cause the mirror to continue tilting in the first direction (e.g., after the first voltage has ceased being supplied) beyond the effective driving range of the first electrostatic comb structure (e.g., because of angular momentum of the mirror in the first direction). As another example, the control device may cause a second voltage to be supplied to a second electrostatic comb structure to cause the second electrostatic comb structure to tilt the mirror about the at least one hinge in a second direction (e.g., that is opposite of the first direction). Then, the control device may cause the second voltage to cease being supplied to the second electrostatic comb structure. This may cause the mirror to continue tilting in the second direction (e.g., after the second voltage has ceased being supplied) beyond the effective driving range of the first electrostatic comb structure (e.g., because of angular momentum of the mirror in the second direction).

Further, the one or more electrostatic comb structures may be positioned at respective sides of the mirror (e.g., that are coincident with an axis of the mirror that is orthogonal to a tilting axis of the mirror), such as a top side and bottom side of the mirror. This reduces a horizontal dimension of the MEMS device, and therefore reduces a number and/or area of unused regions of a chip of the MEMS device as compared to a conventional MEMS device. This reduces a size (e.g., an XY footprint) of the chip of the MEMS device, which reduces a cost and complexity to form the MEMS device (e.g., as compared to that of a conventional MEMS device), and enables the MEMS device to be included in some LIDAR systems that do not have enough room to include a conventional MEMS device.

FIG. 1 is a diagram of an example MEMS device 100 described herein. The MEMS device 100 may be a micro-sized optical device configured to deflect optical beams. As shown in FIG. 1, the MEMS device 100 may include a mirror 102, one or more or electrostatic comb structures 104 (shown in FIG. 1 as a first electrostatic comb structure 104-1 and a second electrostatic comb structure 104-2), and at least one hinge 106 (shown in FIG. 1 as a first hinge 106-1 and a second hinge 106-2).

The mirror 102 may be coated with a reflective coating (e.g., a metallic reflective material, such as gold) for reflecting optical beams. As shown in FIG. 1, the mirror 102 may be suspended by the at least one hinge 106 and may be configured to tilt or rotate about the at least one hinge 106. The at least one hinge 106 may be configured to tilt the mirror 102 (or to allow the mirror 102 to tilt) about a tilting axis 108 (shown in FIG. 1 as an x-axis associated with the MEMS device 100).

The one or more electrostatic comb structures 104 may be positioned on respective sides of the mirror 102. In some implementations, the one or more electrostatic comb structures 104 may be positioned on sides of the mirror 102 that are coincident with an axis (e.g., a y-axis) of the mirror that is orthogonal to the tilting axis 108. For example, as shown in FIG. 1, the first electrostatic comb structure 104-1 may be positioned on a top side of the mirror 102 and the second electrostatic comb structure 104-2 may be positioned on a bottom side of the mirror 102. Accordingly, the first electrostatic comb structure 104-1 and the second electrostatic comb structure 104-2 may be substantially parallel (e.g., within a tolerance, such as 3 degrees) to each other and/or to the tilting axis 108. While FIG. 1 shows two electrostatic comb structures 104, some implementations described herein include a single electrostatic comb structure 104 (e.g., positioned on the top side, the bottom side, the right side, or the left side of the mirror 102).

An electrostatic comb structure 104 may be configured to generate an electrostatic torque (also referred to as a driving torque) to tilt the mirror 102 about the tilting axis 108 on the at least one hinge 106. For example, as shown in FIG. 1, the first electrostatic comb structure 104-1 may be configured to tilt the mirror 102 in a first direction (e.g., in a "positive" direction) about the tilting axis 108 and/or the second electrostatic comb structure 104-2 may be configured to tilt the mirror 102 in a second direction (e.g., in a "negative" direction) about the tilting axis 108.

In some implementations, an electrostatic comb structure 104 may include one or more comb actuators, such as a stator comb actuator and/or a rotor comb actuator. Each of the one or more comb actuators may include a plurality of teeth for engaging with a plurality of teeth of another of the comb actuators. When a voltage is applied to the stator comb actuator, a voltage difference between the rotor comb actuator and the stator comb actuator creates an electrostatic field that causes (e.g., pulls) the plurality of teeth of the rotor comb actuator to engage with the plurality of teeth of the stator comb actuator and thereby tilt the mirror 102 (e.g., in a particular direction about the at least one hinge 106).

As further shown in FIG. 1, a control device 110 may be associated with the MEMS device 100. For example, the control device may be included in the MEMS device 100, or may be a separate device that is connected (e.g., electrically connected) to the MEMS device 100. The control device 110 may be configured to control the one or more electrostatic comb structures 104. For example, the control device 110 may cause respective voltages (e.g., at different, non-coextensive times) to be supplied (e.g., from a power source, not shown in FIG. 1) to the one or more electrostatic comb structures 104. This causes the one or more electrostatic comb structures 104 to generate electrostatic torques to tilt the mirror 102 about the tilting axis 108 (e.g., in one or more different directions). For example, control device 110 may cause a first voltage to be supplied to the first electrostatic comb structure 104-1 to cause the first electrostatic comb structure 104-1 to tilt the mirror 102 about the at least one hinge 106 in a first direction and/or may cause a second voltage to be supplied to the second electrostatic comb structure 104-2 to cause the second electrostatic comb structure 104-2 to tilt the mirror 102 about the at least one hinge 106 in a second direction. Further details relating to the control device 110 are described elsewhere herein.

As indicated above, FIG. 1 is provided merely as one or more examples. Other examples may differ from what is described with regard to FIG. 1.

Figure 2:
FIG. 2 is a diagram of a plot illustrating a relationship between driving efficiency of an electrostatic comb structure and a tilt angle of a mirror of a MEMS device described herein.

FIG. 2 is a diagram of a plot 200 illustrating a relationship between driving efficiency (e.g., in Newton metres per volt) of an electrostatic comb structure (e.g., an electrostatic comb structure 104 of the one or more electrostatic comb structures 104 described herein in relation to FIG. 1) and a tilt angle (e.g., in degrees) of a mirror (e.g., the mirror 102 described herein in relation to FIG. 1) of a MEMS device (e.g., the MEMS device 100 described herein in relation to FIG. 1). As shown by plot 200 in FIG. 2, the driving efficiency is positive for a particular range of tilt angles (e.g., tilt angles between 0 and 5.8 degrees), which is referred to as an effective driving range of the electrostatic comb structure. However, when a tilt angle of the mirror exceeds a maximum value of the particular range (e.g., the tilt angle is greater than 5.8 degrees), the driving efficiency becomes negative. Accordingly, some implementations described herein enable driving (e.g., by the control device 110, as described elsewhere herein) of the electrostatic comb structure during a period of time associated with a positive driving efficiency of the electrostatic comb structure, such as when the tilt angle of the mirror is within the effective driving range of the electrostatic comb structure (e.g., when the tilt angle of the mirror is within the particular range of tilt angles of the mirror).

As indicated above, FIG. 2 is provided as one or more examples. Other examples may differ from what is described with regard to FIG. 2.

Figure 3:
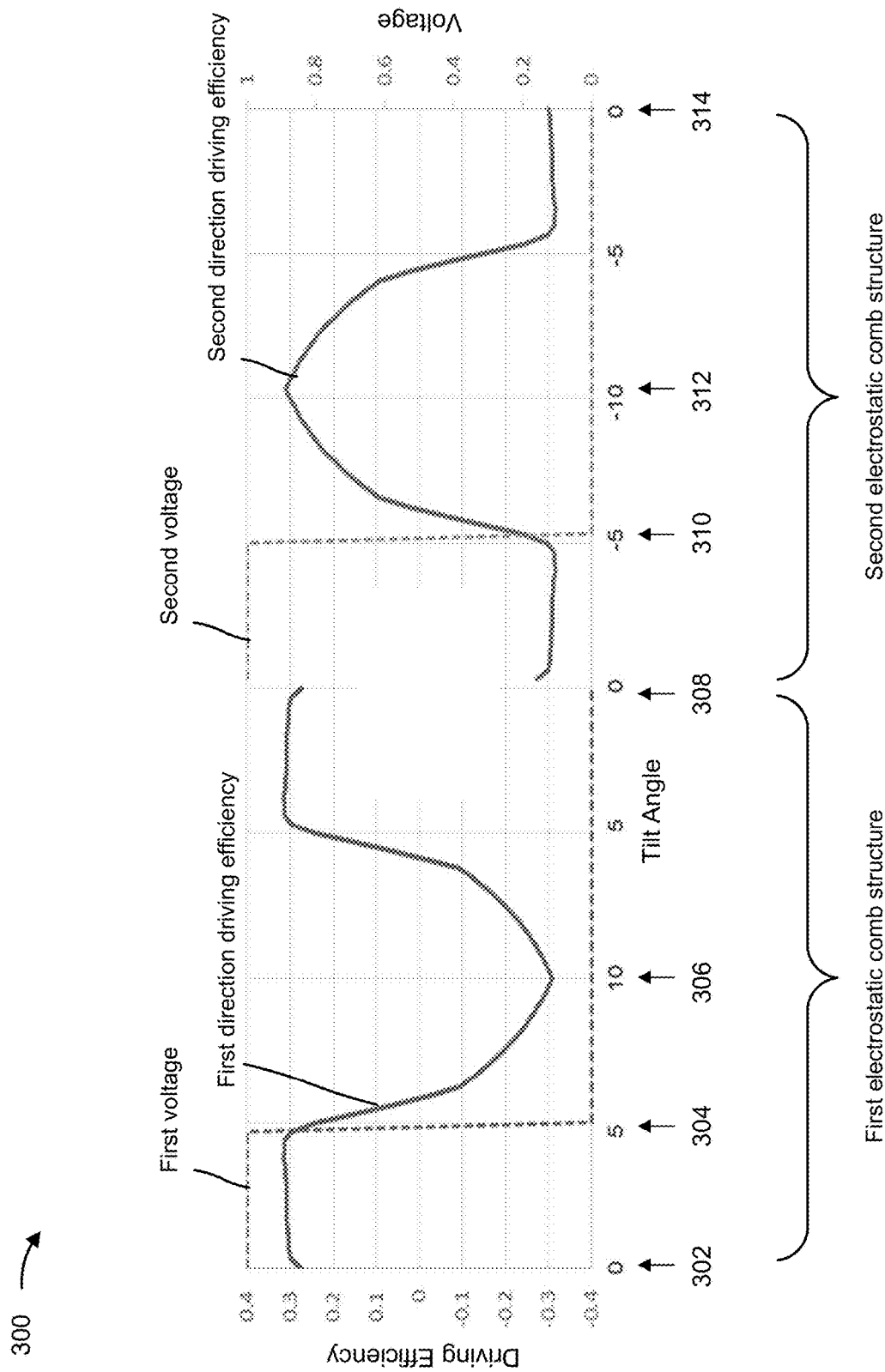
FIG. 3 is a diagram of a plot illustrating a process for controlling one or more electrostatic comb structures of a MEMS device described herein.

FIG. 3 is a diagram of a plot 300 illustrating a process for controlling one or more electrostatic comb structures (e.g., the one or more electrostatic comb structures 104 described herein in relation to FIG. 1) of a MEMS device (e.g., the MEMS device 100 described herein in relation to FIG. 1). In some implementations, one or more process steps illustrated in FIG. 3 may be performed by a control device (e.g., the control device 110 described herein in relation to FIG. 1).

As shown by reference number 302, the control device may cause, for a first period of time, a first voltage (e.g., a positive voltage) to be supplied to a first electrostatic comb structure of the one or more electrostatic comb structures (e.g., the first electrostatic comb structure 104-1 described herein in relation to FIG. 1). For example, the control device may send a control signal to a power source of the MEMS device to cause the power source to supply the first voltage to the first electrostatic comb structure (e.g., via a channel associated with the first electrostatic comb structure) for the first period of time. This may cause the first electrostatic comb structure to tilt (e.g., based on an electrostatic torque created by the first electrostatic comb structure) a mirror of the MEMS device (e.g., the mirror 102 described herein in relation to FIG. 1) about at least one hinge of the MEMS device (e.g., the at least one hinge 106 described herein in relation to FIG. 1) in a first direction (e.g., a positive direction). As shown by reference number 304, after the first period of time and at a first instant of time (e.g., an instant of time immediately after expiration of the first period of time), the control device may cause the first voltage to cease being supplied to the first electrostatic comb structure. For example, the control device may send a control signal to the power source to cause the power source to cease supplying the first voltage to the first electrostatic comb structure.

As further shown in FIG. 3, during the first period of time, the mirror may tilt from a neutral tilt angle (e.g., 0 degrees). At the first instant of time (e.g., when the control device causes the first voltage to cease being supplied to the first electrostatic comb structure), the mirror may be tilted at a particular tilt angle in the first direction (e.g., approximately 5 degrees). As shown in FIG. 3, the particular tilt angle may be less than a maximum tilt angle of the mirror in the first direction (e.g., 10 degrees).

As further shown in FIG. 3, a driving efficiency of the first electrostatic comb structure in the first direction may be positive for positive tilt angles of the mirror during the first period of time and at the first instant of time. That is, the tilt angle of the mirror may be associated with a "positive" driving efficiency of the first electrostatic comb structure (e.g., in the first direction) during the first period of time and at the first instant of time (e.g., the driving efficiency and the tilt angles are both positive during the first period of time and at the first instant of time). Accordingly, the tilt angle of the mirror may be within an effective driving range of the first electrostatic comb structure (e.g., in the first direction) during the first period of time and at the first instant of time.

In some implementations, based on the first voltage being supplied to the first electrostatic comb structure, a driving force (e.g., a driving torque) of the first electrostatic comb structure may be greater than a resistant force of the at least one hinge and/or air (e.g., while the tilt angle of the mirror is within the effective driving range of the first electrostatic comb structure). Accordingly, an angular momentum of the mirror may increase during the first period of time and the angular momentum of the mirror, at the first instant of time, may be greater than zero kilogram meters squared per second ($kg*m^2/s$) in the first direction.

Thus, as further shown in FIG. 3, the mirror may continue to tilt in the first direction after the first instant of time (e.g., due to the angular momentum of the mirror being greater than zero $kg*m^2/s$ in the first direction). Eventually, the angular momentum of the mirror may decrease (e.g., based on the resistant force of the at least one hinge and/or air) until, at a second instant of time, the angular momentum of the mirror may be approximately equal to zero $kg*m^2/s$ (e.g., equal to zero $kg*m^2/s$, within a tolerance). In some implementations, at the second instant of time, the angular momentum of the mirror may satisfy (e.g., be less than or equal to) an angular momentum in the first direction threshold. The angular momentum in the first direction threshold may be less than or equal to 3% of a maximum angular momentum of the mirror in the first direction. In some implementations, as shown by reference number 306, the tilt angle of the mirror may be approximately equal to the maximum tilt angle of the mirror (e.g., equal to 10 degrees, within a tolerance, such as 0.1 degree) in the first direction at the second instant in time.

After the second instant of time, the tilt angle of the mirror in the first direction may decrease (e.g., based on a restoring force of the at least one hinge). Eventually, the tilt angle of the mirror may decrease (e.g., based on the restoring force of the at least one hinge) until, as shown by reference number 308, the tilt angle of the mirror is approximately equal to the neutral tilt angle (e.g., equal to 0 degrees, within a tolerance, such as 0.1 degree).

Accordingly, the control device may cause, for a second period of time, a second voltage (e.g., a negative voltage) to be supplied to a second electrostatic comb structure of the one or more electrostatic comb structures (e.g., the second electrostatic comb structure 104-2 described herein in relation to FIG. 1). For example, the control device may send a control signal to the power source of the MEMS device to cause the power source to supply the second voltage to the second electrostatic comb structure (e.g., via a channel associated with the second electrostatic comb structure) for the second period of time. This may cause the second electrostatic comb structure to tilt (e.g., based on an electrostatic torque created by the second electrostatic comb structure) the mirror of the MEMS device about the at least one hinge of the MEMS device in a second direction (e.g., a negative direction). As shown by reference number 310, after the second period of time and at a third instant of time (e.g., an instant of time immediately after expiration of the second period of time), the control device may cause the second voltage to cease being supplied to the second electrostatic comb structure. For example, the control device may send a control signal to the power source to cause the power source to cease supplying the second voltage to the second electrostatic comb structure.

As shown in FIG. 3, the mirror may tilt from a neutral tilt angle (e.g., 0 degrees) during the second period of time. At the third instant of time (e.g., when the control device causes the second voltage to cease being supplied to the second electrostatic comb structure), the mirror may be tilted at a particular tilt angle in the second direction (e.g., approximately −5 degrees). As shown in FIG. 3, the particular tilt angle may be less than a maximum tilt angle of the mirror in the second direction (e.g., −10 degrees).

As further shown in FIG. 3, a driving efficiency of the second electrostatic comb structure in the second direction may be negative for negative tilt angles of the mirror during the second period of time and at the third instant of time. That is, the tilt angle of the mirror may be associated with a "positive" driving efficiency of the second electrostatic comb structure (e.g., in the second direction) during the second period of time and at the third instant of time (e.g., the driving efficiency and the tilt angles are both negative during the second period of time and at the third instant of time). Accordingly, the tilt angle of the mirror may be within an effective driving range of the second electrostatic comb structure (e.g., in the second direction) during the second period of time and at the third instant of time.

In some implementations, based on the second voltage being supplied to the second electrostatic comb structure, a driving force (e.g., a driving torque) of the second electrostatic comb structure may be greater than a resistant force of the at least one hinge and/or air (e.g., while the tilt angle of the mirror is within the effective driving range of the second electrostatic comb structure). Accordingly, the angular momentum of the mirror may increase during the second period of time and the angular momentum of the mirror, at the third instant of time, may be greater than zero kg*m²/s in the second direction.

Thus, as further shown in FIG. 3, the mirror may continue to tilt in the second direction after the third instant of time (e.g., due to the angular momentum of the mirror being greater than zero kg*m²/s in the second direction). Eventually, the angular momentum of the mirror may decrease (e.g., based on the resistant force of the at least one hinge and/or air) until, at a fourth instant of time, the angular momentum of the mirror may be approximately equal to zero kg*m²/s (e.g., equal to zero kg*m²/s, within a tolerance). In some implementations, at the fourth instant of time, the angular momentum of the mirror may satisfy (e.g., be less than or equal to) an angular momentum in the second direction threshold. The angular momentum in the second direction threshold may be less than or equal to 3% of a maximum angular momentum of the mirror in the second direction. In some implementations, as shown by reference number 312, the tilt angle of the mirror may be approximately equal to the maximum tilt angle of the mirror (e.g., equal to −10 degrees, within a tolerance, such as 0.1 degree) in the second direction at the fourth instant in time.

After the fourth instant of time, the tilt angle of the mirror in the second direction may decrease (e.g., based on a restoring force of the at least one hinge). Eventually, the tilt angle of the mirror may decrease (e.g., based on the restoring force of the at least one hinge) until, as shown by reference number 314, the tilt angle of the mirror is approximately equal to the neutral tilt angle (e.g., equal to 0 degrees, within a tolerance, such as 0.1 degree).

In this way, the control device may control the one or more electrostatic comb structures to cause the mirror to tilt between the maximum tilt angle of the mirror in the first direction and the maximum tilt angle of the mirror in the second direction.

As indicated above, FIG. 3 is provided as one or more examples. Other examples may differ from what is described with regard to FIG. 3.

Figure 4:
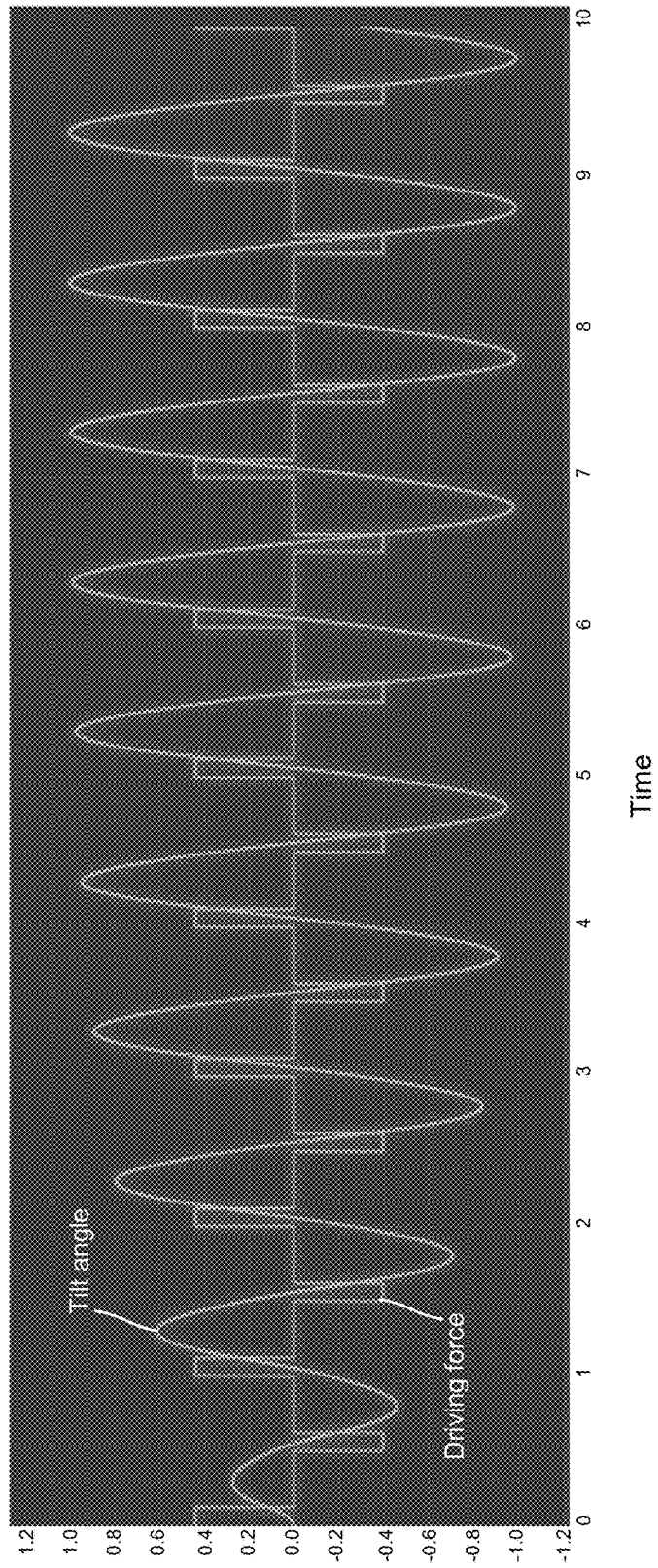
FIG. 4 is a diagram of a plot illustrating an example relationship between a driving force of an electrostatic comb structure and a tilt angle of a mirror of a MEMS device described herein.

FIG. 4 is a diagram of a plot 400 illustrating an example relationship between a driving force of an electrostatic comb structure (e.g., an electrostatic comb structure 104 of the one or more electrostatic comb structures 104 described herein in relation to FIG. 1) and a tilt angle (e.g., in degrees) of a mirror (e.g., the mirror 102 described herein in relation to FIG. 1) of a MEMS device (e.g., the MEMS device 100 described herein in relation to FIG. 1). As shown in FIG. 4, the driving force of the electrostatic comb structure and the tilt angle are normalized and plotted over time. The MEMS device is associated with a 0.1 damping ratio and a 0.4 ratio of effective driving range of the electrostatic comb structure to a maximum tilt range of the mirror. A driving frequency of the electrostatic comb structure matches a resonant frequency of the mirror. As shown in FIG. 4, the maximum tilt range of the mirror may be achieved with a driving force of the electrostatic comb structure that is less than half of a driving force needed for a static tilt (as would be needed in a conventional MEMS device). Accordingly, the MEMS device may have an equivalent dynamic factor that is greater than 2.

As indicated above, FIG. 4 is provided as one or more examples. Other examples may differ from what is described with regard to FIG. 4.

Figure 5:
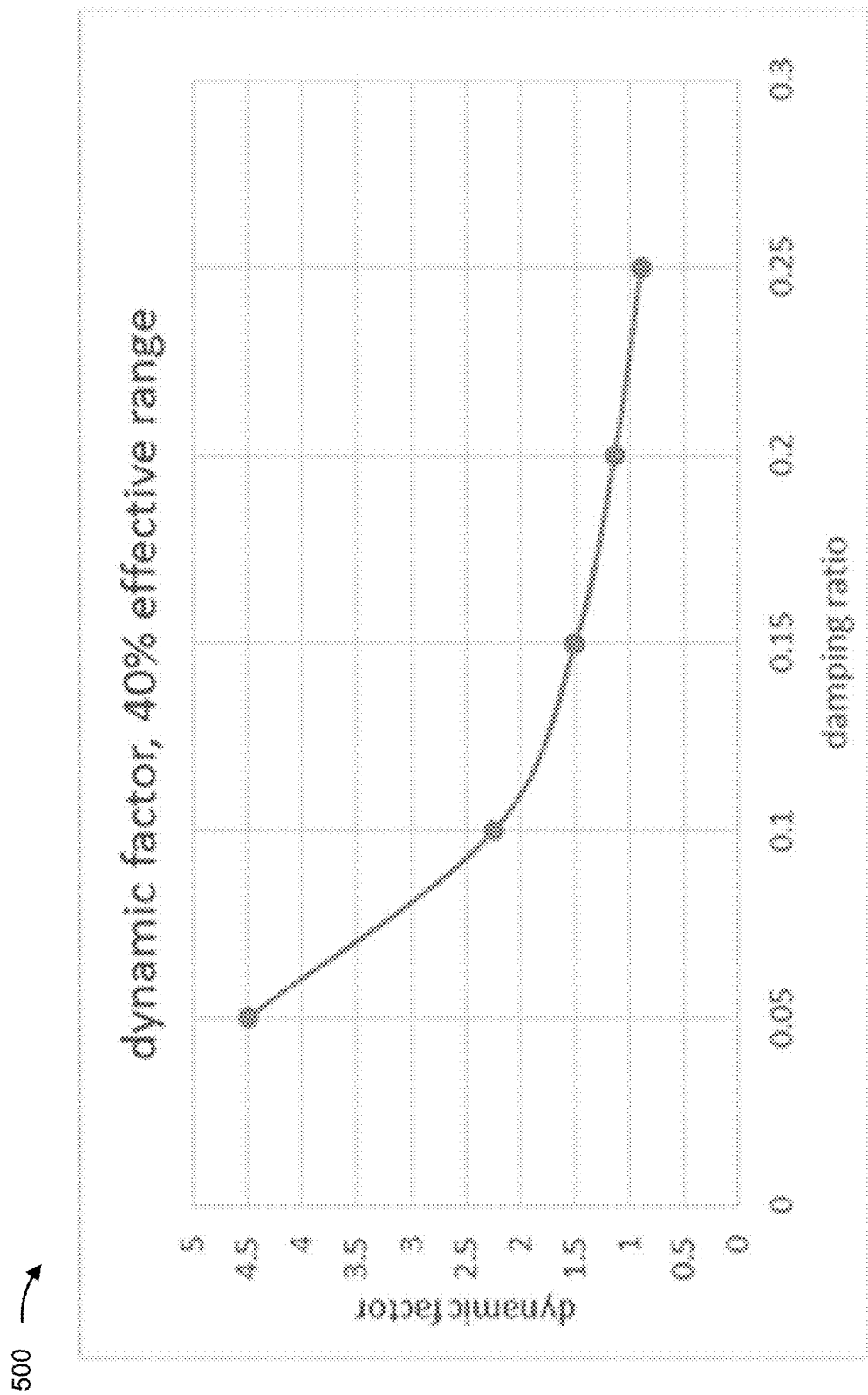
FIG. 5 is a diagram of a plot illustrating an example relationship between a dynamic factor of a MEMs device described herein and a damping ratio of the MEMS device.

FIG. 5 is a diagram of a plot 500 illustrating an example relationship between a dynamic factor of a MEMS device (e.g., the MEMS device 100 described herein in relation to FIG. 1) and a damping ratio of the MEMS device. The MEMS device is associated with a 0.4 ratio of effective driving range of an electrostatic comb structure (e.g., an electrostatic comb structure 104 of the one or more electrostatic comb structures 104 described herein in relation to FIG. 1) of the MEMS device to a maximum tilt range of a mirror (e.g., the mirror 102 described herein in relation to FIG. 1) of the MEMS device. As shown in FIG. 5, a damping ratio of less than or equal to 0.2 yields a dynamic factor that is greater than 1.0. Accordingly, in some implementations, the MEMS device (e.g., as described elsewhere herein) may provide a damping ratio that is less than or equal to 0.2.

As indicated above, FIG. 5 is provided as an example. Other examples may differ from what is described with regard to FIG. 5.

Figure 6:
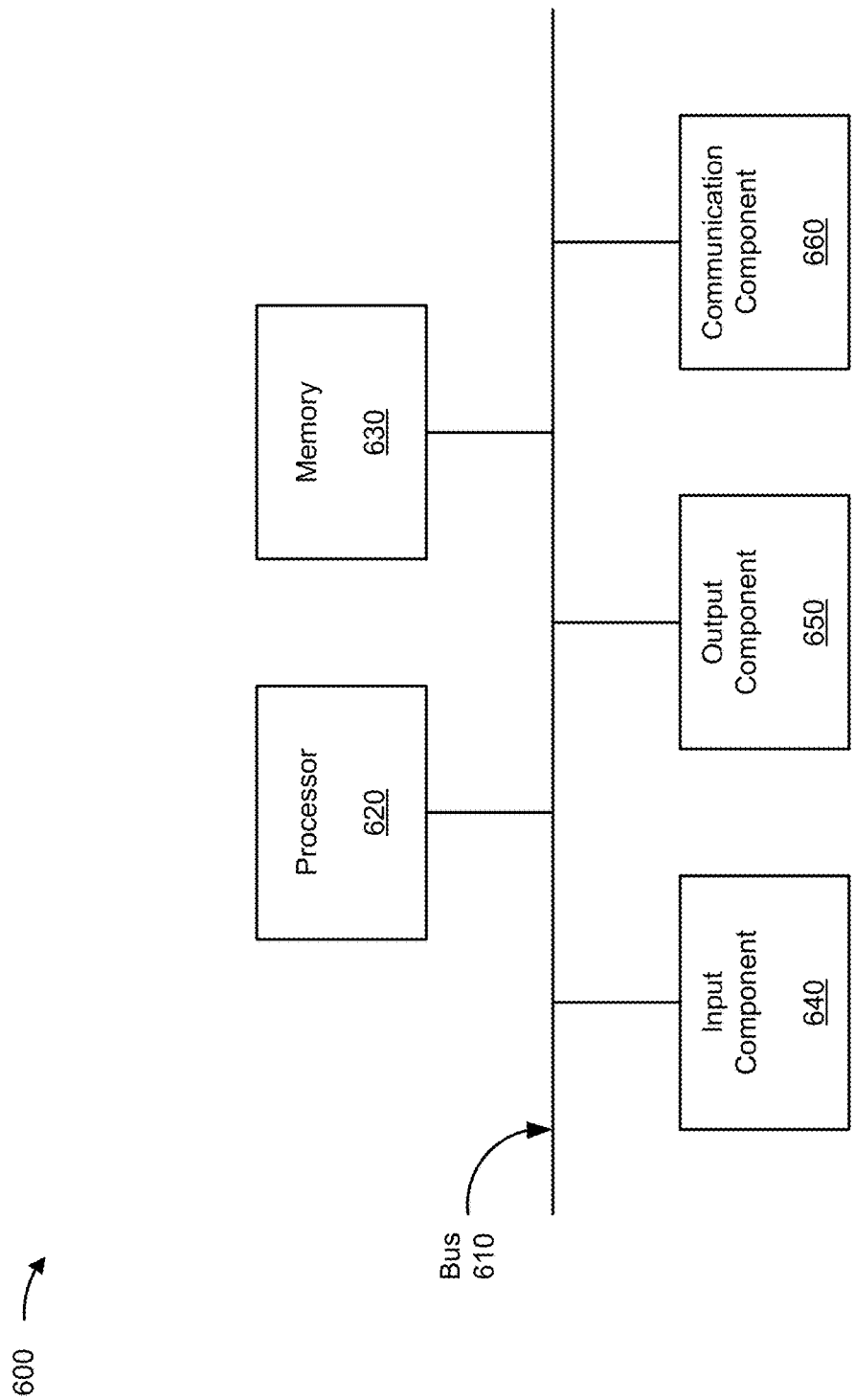
FIG. 6 is a diagram of example components of a control device described herein.

FIG. 6 is a diagram of example components of a device 600, which may correspond to the control device 110. In some implementations, the control device 110 may include one or more devices 600 and/or one or more components of device 600. As shown in FIG. 6, device 600 may include a bus 610, a processor 620, a memory 630, an input component 640, an output component 650, and a communication component 660.

Bus 610 includes one or more components that enable wired and/or wireless communication among the components of device 600. Bus 610 may couple together two or more components of FIG. 6, such as via operative coupling, communicative coupling, electronic coupling, and/or electric coupling. Processor 620 includes a central processing unit, a graphics processing unit, a microprocessor, a controller, a microcontroller, a digital signal processor, a field-programmable gate array, an application-specific integrated circuit, and/or another type of processing component. Processor 620 is implemented in hardware, firmware, or a combination of hardware and software. In some implementations, processor 620 includes one or more processors capable of being programmed to perform one or more operations or processes described elsewhere herein.

Memory 630 includes volatile and/or nonvolatile memory. For example, memory 630 may include random access memory (RAM), read only memory (ROM), a hard disk drive, and/or another type of memory (e.g., a flash memory, a magnetic memory, and/or an optical memory). Memory 630 may include internal memory (e.g., RAM, ROM, or a hard disk drive) and/or removable memory (e.g., removable via a universal serial bus connection). Memory 630 may be a non-transitory computer-readable medium. Memory 630 stores information, instructions, and/or software (e.g., one or more software applications) related to the operation of device 600. In some implementations, memory 630 includes one or more memories that are coupled to one or more processors (e.g., processor 620), such as via bus 610.

Input component 640 enables device 600 to receive input, such as user input and/or sensed input. For example, input component 640 may include a touch screen, a keyboard, a keypad, a mouse, a button, a microphone, a switch, a sensor, a global positioning system sensor, an accelerometer, a gyroscope, and/or an actuator. Output component 650 enables device 600 to provide output, such as via a display, a speaker, and/or a light-emitting diode. Communication component 660 enables device 600 to communicate with other devices via a wired connection and/or a wireless connection. For example, communication component 660 may include a receiver, a transmitter, a transceiver, a modem, a network interface card, and/or an antenna.

Device 600 may perform one or more operations or processes described herein. For example, a non-transitory computer-readable medium (e.g., memory 630) may store a set of instructions (e.g., one or more instructions or code) for execution by processor 620. Processor 620 may execute the set of instructions to perform one or more operations or processes described herein. In some implementations, execution of the set of instructions, by one or more processors 620, causes the one or more processors 620 and/or the device 600 to perform one or more operations or processes described herein. In some implementations, hardwired circuitry is used instead of or in combination with the instructions to perform one or more operations or processes described herein. Additionally, or alternatively, processor 620 may be configured to perform one or more operations or processes described herein. Thus, implementations described herein are not limited to any specific combination of hardware circuitry and software.

The number and arrangement of components shown in FIG. 6 are provided as an example. Device 600 may include additional components, fewer components, different components, or differently arranged components than those shown in FIG. 6. Additionally, or alternatively, a set of components (e.g., one or more components) of device 600 may perform one or more functions described as being performed by another set of components of device 600.

FIG. 7 is a flowchart of an example process 700 associated with controlling one or more electrostatic comb structures of a MEMS device. The MEMS device may include a mirror (e.g., mirror 102), at least one hinge (e.g., at least one hinge 106), a first electrostatic comb structure (e.g., first electrostatic comb structure 104-1), a second electrostatic comb structure (e.g., second electrostatic comb structure 104-2), and/or a control device (e.g., control device 110). In some implementations, one or more process blocks of FIG. 7 are performed by the control device. In some implementations, one or more process blocks of FIG. 7 are performed by another device or a group of devices separate from or including the control device. Additionally, or alternatively, one or more process blocks of FIG. 7 may be performed by one or more components of device 600, such as processor 620, memory 630, input component 640, output component 650, and/or communication component 660.

As shown in FIG. 7, process 700 may include causing, for a first period of time, a first voltage to be supplied to the first electrostatic comb structure to cause the first electrostatic comb structure to tilt the mirror about the at least one hinge in a first direction (block 710). For example, the control device may cause, for a first period of time, a first voltage to be supplied to the first electrostatic comb structure to cause the first electrostatic comb structure to tilt the mirror about the at least one hinge in a first direction, as described above.

As further shown in FIG. 7, process 700 may include causing, after the first period of time and at a first instant of time, the first voltage to cease being supplied to the first electrostatic comb structure (block 720). For example, the control device may cause, after the first period of time and at a first instant of time, the first voltage to cease being supplied to the first electrostatic comb structure, as described above. In some implementations, a tilt angle of the mirror, at the first instant of time, is less than a maximum tilt angle of the mirror in the first direction.

As further shown in FIG. 7, process 700 may include causing, after the first instant of time and for a second period of time, a second voltage to be supplied to the second electrostatic comb structure to cause the second electrostatic comb structure to tilt the mirror about the at least one hinge in a second direction (block 730). For example, the control device may cause, after the first instant of time and for a second period of time, a second voltage to be supplied to the second electrostatic comb structure to cause the second electrostatic comb structure to tilt the mirror about the at least one hinge in a second direction, as described above.

As further shown in FIG. 7, process 700 may include causing, after the second period of time and at a second instant of time, the second voltage to cease being supplied to the second electrostatic comb structure (block 740). For example, the control device may cause, after the second period of time and at a second instant of time, the second voltage to cease being supplied to the second electrostatic comb structure, as described above. In some implementations, the tilt angle of the mirror, at the second instant of time, is less than a maximum tilt angle of the mirror in the second direction.

Process 700 may include additional implementations, such as any single implementation or any combination of implementations described below and/or in connection with one or more other processes described elsewhere herein.

In a first implementation, the tilt angle of the mirror, at the first instant of time, is within an effective driving range of the first electrostatic comb structure.

In a second implementation, alone or in combination with the first implementation, the tilt angle of the mirror, at the first instant of time, is associated with a positive driving efficiency of the first electrostatic comb structure.

In a third implementation, alone or in combination with one or more of the first and second implementations, an angular momentum of the mirror, at the first instant of time, is greater than zero kilogram meters squared per second in the first direction.

In a fourth implementation, alone or in combination with one or more of the first through third implementations, the tilt angle of the mirror, at a third instant of time after the first instant of time and before the second period of time, is approximately equal to the maximum tilt angle of the mirror in the first direction.

In a fifth implementation, alone or in combination with one or more of the first through fourth implementations, the tilt angle of the mirror, at a fourth instant of time after the third instant of time and before the second period of time, is less than or equal to 0.1 degree.

In a sixth implementation, alone or in combination with one or more of the first through fifth implementations, an angular momentum of the mirror, at the second instant of time, is greater than zero kilogram meters squared per second in the second direction.

In a seventh implementation, alone or in combination with one or more of the first through sixth implementations, at a third instant of time after the second instant of time, the tilt angle of the mirror is approximately equal to the maximum tilt angle of the mirror in the second direction, and an angular momentum of the mirror is approximately equal to zero kilogram meters squared per second.

In an eighth implementation, alone or in combination with one or more of the first through seventh implementations, at a fourth instant of time after the third instant of time, the tilt angle of the mirror is approximately equal to zero degrees, and the angular momentum of the mirror is approximately equal to zero kilogram meters squared per second.

Although FIG. 7 shows example blocks of process 700, in some implementations, process 700 includes additional blocks, fewer blocks, different blocks, or differently arranged blocks than those depicted in FIG. 7. Additionally, or alternatively, two or more of the blocks of process 700 may be performed in parallel.

The foregoing disclosure provides illustration and description, but is not intended to be exhaustive or to limit the implementations to the precise forms disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "bottom," "above," "upper," "top," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. A micro-electro-mechanical system (MEMS) device, comprising:
  a mirror;
  at least one hinge;
  a first electrostatic comb structure;
  a second electrostatic comb structure; and
  a control device, configured to:
    cause, for a first period of time, a first voltage to be supplied to the first electrostatic comb structure to cause the first electrostatic comb structure to tilt the mirror about the at least one hinge in a first direction;
    cause, after the first period of time and at a first instant of time, the first voltage to cease being supplied to the first electrostatic comb structure,
      wherein a tilt angle of the mirror, at the first instant of time, is less than a maximum tilt angle of the mirror in the first direction;

cause, after the first instant of time and for a second period of time, a second voltage to be supplied to the second electrostatic comb structure to cause the second electrostatic comb structure to tilt the mirror about the at least one hinge in a second direction; and
cause, after the second period of time and at a second instant of time, the second voltage to cease being supplied to the second electrostatic comb structure,
wherein the tilt angle of the mirror, at the second instant of time, is less than a maximum tilt angle of the mirror in the second direction.

2. The MEMS device of claim 1, wherein the tilt angle of the mirror, at the first instant of time, is within an effective driving range of the first electrostatic comb structure.

3. The MEMS device of claim 1, wherein the tilt angle of the mirror, at the first instant of time, is associated with a positive driving efficiency of the first electrostatic comb structure.

4. The MEMS device of claim 1, wherein an angular momentum of the mirror, at the first instant of time, is greater than zero kilogram meters squared per second in the first direction.

5. The MEMS device of claim 1, wherein the tilt angle of the mirror, at a third instant of time after the first instant of time and before the second period of time, is approximately equal to the maximum tilt angle of the mirror in the first direction.

6. The MEMS device of claim 5, wherein the tilt angle of the mirror, at a fourth instant of time after the third instant of time and before the second period of time, is less than or equal to 0.1 degree.

7. The MEMS device of claim 1, wherein an angular momentum of the mirror, at the second instant of time, is greater than zero kilogram meters squared per second in the second direction.

8. The control device of claim 1, wherein, at a third instant of time after the second instant of time:
the tilt angle of the mirror is approximately equal to the maximum tilt angle of the mirror in the second direction; and
an angular momentum of the mirror is approximately equal to zero kilogram meters squared per second.

9. The MEMS device of claim 8, wherein, at a fourth instant of time after the third instant of time, the tilt angle of the mirror is approximately equal to zero degrees.

10. A control device, comprising:
one or more processors to:
cause, for a first period of time, a first voltage to be supplied to a first electrostatic comb structure of a micro-electro-mechanical system (MEMS) device to cause the first electrostatic comb structure to tilt a mirror of the MEMS device about at least one hinge of the MEMS device in a first direction; and
cause, after the first period of time and at a first instant of time, the first voltage to cease being supplied to the first electrostatic comb structure,
wherein a tilt angle of the mirror, at the first instant of time, is less than a maximum tilt angle of the mirror in the first direction.

11. The control device of claim 10, wherein the tilt angle of the mirror, at the first instant of time, is within an effective driving range of the first electrostatic comb structure.

12. The control device of claim 10, wherein an angular momentum of the mirror, at the first instant of time, is greater than zero kilogram meters squared per second in the first direction.

13. The control device of claim 10, wherein the tilt angle of the mirror, at a second instant of time after the first instant of time, is approximately equal to a maximum tilt angle of the mirror in the first direction.

14. The control device of claim 13, wherein the tilt angle of the mirror, at a third instant of time after the second instant of time, is approximately equal to zero degrees.

15. The control device of claim 10, wherein the one or more processors are further to:
cause, after the first instant of time and for a second period of time, a second voltage to be supplied to a second electrostatic comb structure of the MEMS device to cause the second electrostatic comb structure to tilt the mirror about the at least one hinge in a second direction; and
cause, after the second period of time and at second instant of time, the second voltage to cease being supplied to the second electrostatic comb structure,
wherein the tilt angle of the mirror, at the second instant of time, is less than a maximum tilt angle of the mirror in the second direction.

16. A method, comprising:
causing, by a control device and for a period of time, a voltage to be supplied to an electrostatic comb structure of a micro-electro-mechanical system (MEMS) device to cause the electrostatic comb structure to tilt a mirror of the MEMS device about at least one hinge of the MEMS device in a particular direction; and
causing, by the control device, after the period of time and at an instant of time, the voltage to cease being supplied to the electrostatic comb structure,
wherein an angular momentum of the mirror, at the instant of time, is greater than zero kilogram meters squared per second in the particular direction.

17. The method of claim 16, wherein a tilt angle of the mirror, at the instant of time, is associated with a positive driving efficiency of the electrostatic comb structure.

18. The method of claim 16, wherein a tilt angle of the mirror, at the instant of time, is less than a maximum tilt angle of the mirror in the particular direction.

19. The method of claim 16, wherein a tilt angle of the mirror, at another instant of time after the instant of time, is approximately equal to a maximum tilt angle of the mirror in the particular direction.

20. The method of claim 19, wherein the tilt angle of the mirror, at an additional instant of time after the other instant of time, is approximately equal to zero degrees.

\* \* \* \* \*